United States Patent
Park et al.

(10) Patent No.: US 9,111,779 B2
(45) Date of Patent: Aug. 18, 2015

(54) IC RESISTOR FORMED WITH INTEGRAL HEATSINKING STRUCTURE

(75) Inventors: Young-Joon Park, Plano, TX (US); Ki-Don Lee, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 1253 days.

(21) Appl. No.: 12/537,994

(22) Filed: Aug. 7, 2009

(65) Prior Publication Data
US 2010/0032770 A1   Feb. 11, 2010

Related U.S. Application Data

(60) Provisional application No. 61/087,081, filed on Aug. 7, 2008.

(51) Int. Cl.
| | |
|---|---|
| H01L 29/00 | (2006.01) |
| H01L 27/08 | (2006.01) |
| H01L 23/367 | (2006.01) |
| H01L 49/02 | (2006.01) |
| H01L 27/02 | (2006.01) |

(52) U.S. Cl.
CPC .......... *H01L 27/0802* (2013.01); *H01L 23/367* (2013.01); *H01L 28/20* (2013.01); *H01L 27/0248* (2013.01); *H01L 2924/0002* (2013.01); *H01L 2924/3011* (2013.01)

(58) Field of Classification Search
CPC .................. H01L 2924/19043; H01L 28/20; H01L 23/5228
USPC .......... 257/379, 380, 381, E21.004, E27.016, 257/E29.325, 528–543; 438/382, 332, 383
See application file for complete search history.

(56) References Cited

U.S. PATENT DOCUMENTS

| | | | | |
|---|---|---|---|---|
| 5,363,084 | A * | 11/1994 | Swinehart | 338/308 |
| 5,952,722 | A * | 9/1999 | Watanabe | 257/754 |
| 2005/0101098 | A1* | 5/2005 | Gau | 438/379 |
| 2005/0179113 | A1* | 8/2005 | Kim et al. | 257/595 |
| 2005/0221611 | A1* | 10/2005 | Yamamoto | 438/639 |
| 2006/0087000 | A1* | 4/2006 | Okuno | 257/506 |

* cited by examiner

Primary Examiner — Cuong Q Nguyen
(74) Attorney, Agent, or Firm — Alan A. R. Cooper; Frank D. Cimino

(57) ABSTRACT

A resistor is formed on field oxide with a portion of the resistor body configured to overlap an active region in an integrated circuit (IC) substrate to provide heatsinking for the resistor body. In one embodiment, cooling fingers extend from the resistor body beyond the field oxide to overlap the active region. In another embodiment, minor areas of the resistor body overlap the active region. The resistor body may be formed of polycrystalline silicon (polysilicon), silicided polysilicon, or metal. An oxide having greater thermal conductance than the field oxide is formed between the overlapping parts of the resistor body and the active region.

24 Claims, 4 Drawing Sheets

IC RESISTOR FORMED WITH INTEGRAL HEATSINKING STRUCTURE

This is a non-provisional of Application No. 61/087,081 filed Aug. 7, 2008, the entirety of which is incorporated herein by reference.

BACKGROUND

This invention relates to the field of integrated circuits in general; and, more particularly, to resistors and their manufacture in integrated circuits.

Resistors in integrated circuits (ICs) are subject to heating, commonly known as Joule heating or ohmic heating, resulting from electrical current flowing through the resistors. The amount of such heating is a function of the amount of electrical current and the thermal paths from the resistor bodies to the IC substrates.

A typical architecture for a IC resistor includes a resistor body formed on top of field oxide and contacts (of, e.g., tungsten, aluminum or copper) for connecting ends of the resistor body to metal interconnect lines (of, e.g., aluminum or copper). Resistors are located on field oxide to minimize capacitance relative to other IC elements such as the substrate. Some IC resistors have silicided bodies, wherein a layer of metal silicide (e.g., nickel silicide, cobalt silicide, titanium silicide or platinum silicide) is formed on a top surface of a resistor body formed of polycrystalline silicon (i.e., polysilicon). Other IC resistors have polysilicon bodies with silicided regions at each end to reduce electrical resistance to the contacts that connect to the metal interconnect lines. Still other IC resistors may have metal bodies.

Joule heating, which is predominantly generated in the resistor body, can undesirably accelerate degradation mechanisms which may cause the IC to malfunction or fail completely. In silicided body resistors, such degradation mechanisms include breakdown of the metal silicide into regions of silicon rich material and metal rich material (known as agglomeration), and void formations in the metal interconnect lines where they overlap the resistor end contacts. In polysilicon body resistors, they include redistribution of dopant, agglomeration of silicided regions (if present) and void formations. And, in metal body resistors, they include void formations in the resistor bodies themselves, as well as in the metal interconnect/contact overlap. Electromigration defects are also accelerated by Joule heating.

Joule heating is exacerbated by the fact that field oxide is typically comprised of silicon dioxide, which has a low thermal conductivity compared to the semiconductor material comprising the IC substrate and active regions (e.g., silicon or silicon-germanium). This results in a higher thermal impedance between the resistor body and the IC substrate than would be the case for a similar resistor formed on top of a thin oxide layer, such as a gate dielectric layer used in MOS transistors, over an active region of the IC substrate. A resistor with a higher thermal impedance to the IC substrate produces a higher temperature in the resistor body than a similar resistor with a lower thermal impedance to the IC substrate for an equal amount of Joule heating (measured in watts), and thus undesirably accelerates the above degradation mechanisms. Another disadvantage of Joule heating in resistors is that it can also thermally accelerate degradation mechanisms in nearby transistors or other components.

SUMMARY

The invention provides a resistor formed with heatsink structure to address the problems discussed above. In one aspect, the invention provides an IC resistor having a resistor body formed over an oxide with a portion of the resistor body material configured to provide a thermally conductive path to an active region in the IC In an example embodiment, described in greater detail below, the resistor body is formed over a field oxide and has thermally conductive fingers that extend outwardly of the resistor body beyond the field oxide into overlapping positions with an underlying region of the substrate. In another described example embodiment, a majority of the resistor body is formed over field oxide, with minor areas formed over non-field oxide regions of a substrate. The overlapped regions of the substrate are preferably active regions, and an insulating oxide having greater thermal conductivity than the field oxide is preferably disposed between the overlapped regions and the resistor body. The resistor body may, for example, comprise polycrystalline silicon (polysilicon), silicided polysilicon, or metal; the overlapped substrate regions are preferably active regions of the substrate; and an insulating dielectric material having a lower thermal resistance than the field oxide is preferably disposed between the overlapped regions and the resistor body.

DETAILED DESCRIPTION OF EXAMPLE EMBODIMENTS

An example resistor formed in an integrated circuit (IC) in accordance with principles of the invention has a resistor body formed over a field oxide on a substrate that has integral portions that extend laterally to overlap areas of the substrate beyond the field oxide that provide a lower thermal resistance than the field oxide. In one embodiment, spaced fingers extend outwardly from perimetrical portions of the resistor body to overlap regions of an active region covered with a lower thermal resistance material, such as an oxide of a MOS transistor gate dielectric layer, in order to provide an improved thermally conductive path to the substrate outside of the field oxide. The fingers are preferably made small compared to the remainder of the resistor body area, so that electrical impedance (DC or AC) of the resistor is not substantially changed.

In another example, the resistor is configured so that areas of substrate having lower thermal resistance than field oxide (such as areas of substrate covered with a transistor gate dielectric layer material) extend under the resistor body, to provide improved thermal conductivity from the resistor body to the substrate. The regions of overlap between the substrate and the resistor body form a capacitor that does not substantially change the electrical impedance (DC or AC) of the resistor.

Figure 1A:
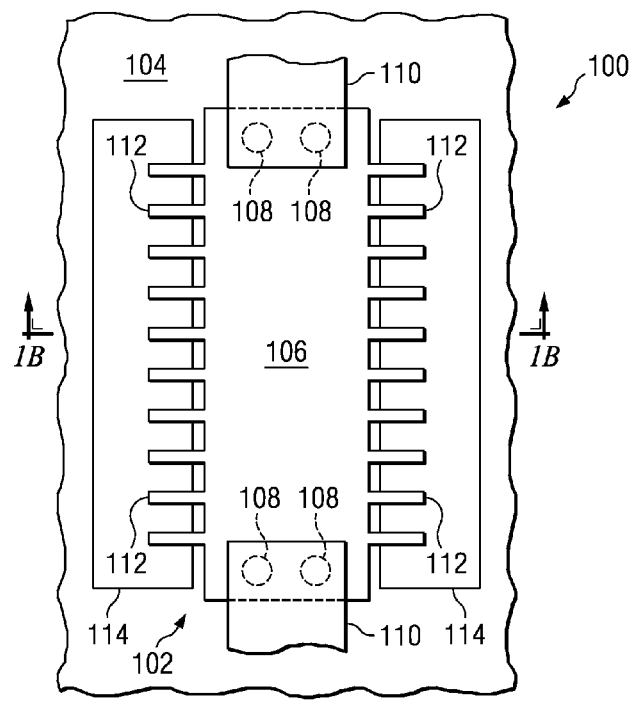
FIG. 1A is a top view of an example implementation of a resistor formed in an integrated circuit (IC) in accordance with principles of the invention.
Figure 1B:
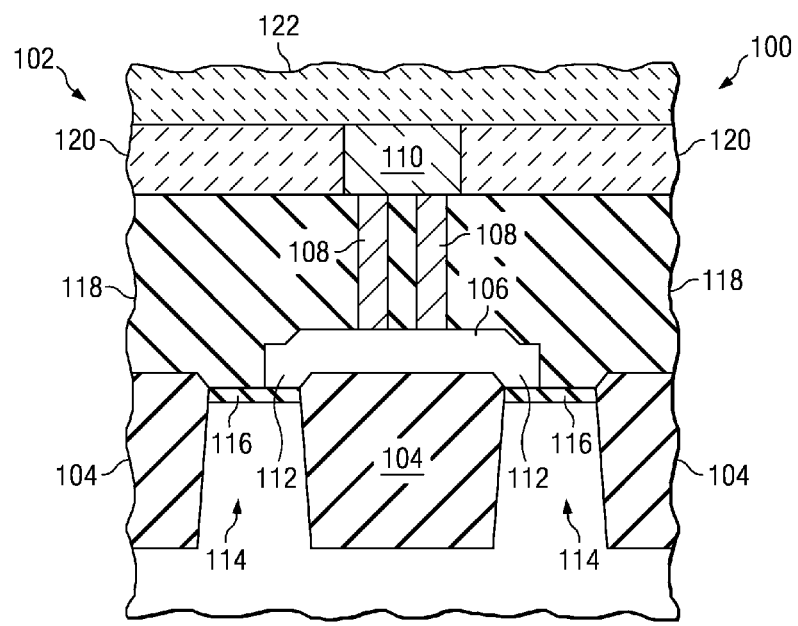
FIG. 1B is a cross-sectional view of the same resistor, taken along the line 1B-1B of FIG. 1A.

FIGS. 1A-1B illustrate an integrated circuit 100 with a resistor 102 on a field oxide 104. Field oxide 104 may, e.g., be 250 to 500 nanometers thick silicon dioxide formed by shallow trench isolation (STI) or local oxidation of silicon (LOCOS) in the IC 100. The depicted resistor 102 includes an elongated resistor body 106 (of, e.g., polysilicon, silicided polysilicon, or metal), contacts 108 (of, e.g., tungsten, aluminum or copper) formed on opposite ends (commonly called resistor heads) of the resistor body 106 to provide electrical connections to the resistor body, and metal interconnect lines 110 which are connected to the contacts 108 to electrically connect the resistor 102 to other components in the IC 100. According to the instant embodiment, one or more cooling fingers 112 extend laterally from perimetrical sides of the resistor body 106 and overlap one or more (preferably) active regions 114 of the IC substrate (which may comprise silicon, silicon germanium or other IC substrate material). This is advantageous because the thermal path from the resistor body 106 through the fingers 112 to the active regions 114 is shorter and offers less thermal resistance than a thermal path from the resistor body 106 through the field oxide 104 under the resistor 102. The illustrated IC resistor 102 thus exhibits less temperature increase in the resistor body 106 compared to equivalent resistors without cooling fingers for equal electrical power dissipation in the resistor bodies. A lower temperature increase results in a desirable lower rate of degradation and hence longer operating lifetime for the IC 100.

Active regions 114 include an electrically insulating material, such as a gate dielectric layer for a MOS transistor, between the substrate and the cooling fingers 112. The configuration of the cooling fingers 112 is such that no substantial DC electrical current flows through the cooling fingers 112; this is advantageous because the DC electrical impedance of the resistor 102 is substantially unchanged by the cooling fingers 112. A width of the cooling fingers 112 is preferably a minimum width as established by the fabrication practices of the IC 100. This is advantageous because minimizing the width of the cooling fingers minimizes the effect of the cooling fingers 112 on the AC electrical impedance of the resistor 102. The depicted configuration shows two rows of fingers 112 formed integrally with the body 106 and extending laterally from spaced positions along opposite perimetrical sides not overlapped by the lines 110. The illustrated fingers 112 have elongated shapes with widths of minimum dimension (taken in a direction of current flow between opposite end contacts 108 in FIG. 1A) and lengths of sufficient dimension (taken in a direction transverse to the direction of current flow in FIG. 1A) to extend beyond the field oxide into overlap positions with the active regions 114.

As shown in FIG. 1B, the resistor body 106 is formed over the field oxide 104 with the fingers 112 extending beyond the field oxide 104 to locations overlapping a layer of insulating material 116 covering the substrate active regions 114. The insulating layer 116 provides a high thermal conductance (e.g., greater than 0.4 milliwatts per square micron per degree Kelvin) and a very high electrical impedance (e.g., greater than $3\times10^{15}$ ohm-micron$^2$). Contacts 108 extend from the resistor body 106 up through a pre-metal dielectric (PMD) layer 118 of, e.g., 350 to 1000 nanometers thick silicon dioxide, to connect to the metal interconnect lines 110. Metal interconnect lines 110 are formed in a first intra-metal dielectric (IMD) layer 120 of, e.g., 100 to 500 nanometers of silicon dioxide or low-k dielectric material such as organosilicate glass (OSG), carbon-doped silicon oxides (SiCO or CDO), or methylsilsesquioxane (MSQ). A first interlevel dielectric (ILD) layer 122 of, e.g., 100 to 500 nanometers of silicon dioxide or low-k dielectric material is formed on a top surface of the first IMD layer 120.

Figure 2:
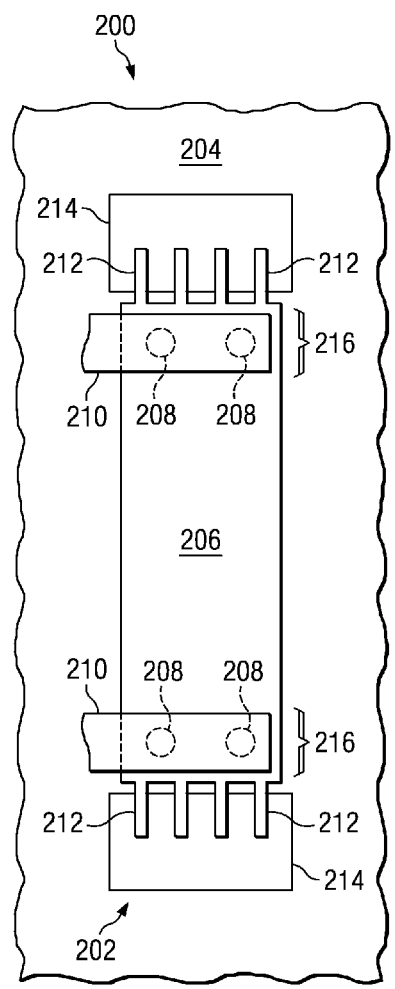
FIG. 2 is a top view of another example implementation of a resistor formed in an IC in accordance with the principles of the invention.

FIG. 2 depicts an IC 200 including a resistor 202 formed according to another example embodiment of principles of the invention. Resistor 202 is formed over a region of field oxide 204 and includes an elongated resistor body 206 (of, e.g., polysilicon, silicided polysilicon, or metal), contacts 208 formed on and connected to the resistor body 206, and metal interconnect lines 210 formed on the contacts 208 to electrically connect the resistor to other components in the IC 200. One or more cooling fingers 212 extend longitudinally from ends of the resistor body 206 and overlap one or more active regions 214 formed in the IC substrate. This configuration is advantageous because it optimally balances cooling at the resistor heads 216 with usage of IC area dedicated to the resistor 202, thus providing reduction in rates of degradation mechanisms affecting the resistor heads 216, contacts 208 and metal interconnect lines 210. This is particularly advantageous for resistors with mostly unsilicided polysilicon bodies, as degradation mechanisms predominantly affect the resistor heads 216 which are commonly silicided, as well as the contacts and metal interconnect lines. Cooling the resistor heads 216 is furthermore advantageous because the resistor body 206 is cooled through thermal contact with the resistor heads 216, causing reduced rates of degradation mechanisms in the resistor body 206. As for IC 100 described previously, a width (taken transverse to a direction of current flow between opposite end contacts 208 in FIG. 2) of the cooling fingers 212 is preferably a minimum width as established by the fabrication practices of the IC 200; and a length (taken in a direction transverse to current flow in FIG. 2) is of sufficient dimension to extend from the resistor heads 216 beyond the field oxide into overlap positions with the active regions 214. This is advantageous because minimizing the width of the cooling fingers minimizes the effect of the cooling fingers 212 on the AC electrical impedance of the resistor 202.

Figure 3:
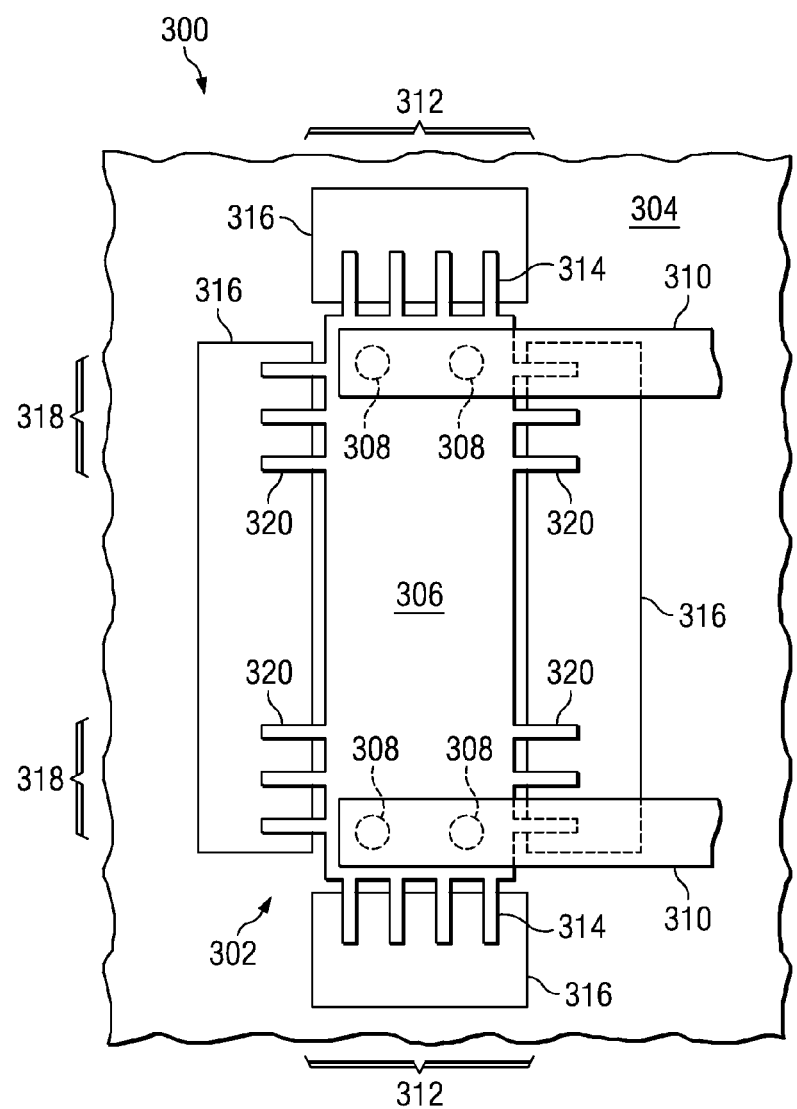
FIG. 3 is a top view of another example implementation of a resistor formed in an IC in accordance with the principles of the invention.

FIG. 3 depicts an IC 300 with a resistor 302, formed on a region of field oxide 304 according to a further example embodiment of principles of the invention. The resistor 302 includes a resistor body 306, contacts 308 formed on and connected to the resistor body 306 at the resistor heads, and metal interconnect lines 310 formed on the contacts 308 to electrically connect the resistor to other components in the IC 300. First pluralities 312 of cooling fingers 314 extend outwardly from respective opposite ends of the elongated resistor body 306 and overlap one or more substrate (preferably, active) regions 316, and second pluralities 318 of cooling fingers 320 extend outwardly from sides of the resistor body 306 near the ends and overlap substrate active regions 316. This is advantageous because cooling is maximized at the resistor heads, thus providing maximum reduction in rates of degradation mechanisms affecting the resistor heads, contacts 308 and metal interconnect lines 310. This is also particularly advantageous for resistors with unsilicided polysilicon bodies, as degradation mechanisms predominantly affect the ends of the resistor bodies, which are commonly silicided, and the contacts and metal interconnect lines. Length dimensions (taken in a direction of current flow between opposite end contacts 308 in FIG. 2) of the second cooling fingers 320 may be different from length dimensions (taken in a direction transverse to the direction of current flow in FIG. 2) of the first cooling fingers 314. As with the previously described embodiments, widths of the cooling fingers 314, 320 are preferably close to a minimum width as established by the fabrication practices of the IC 300. This is advantageous because minimizing the width of the cooling fingers minimizes the effect of the cooling fingers 314, 320 on the AC electrical impedance of the resistor 302.

Figure 4A:
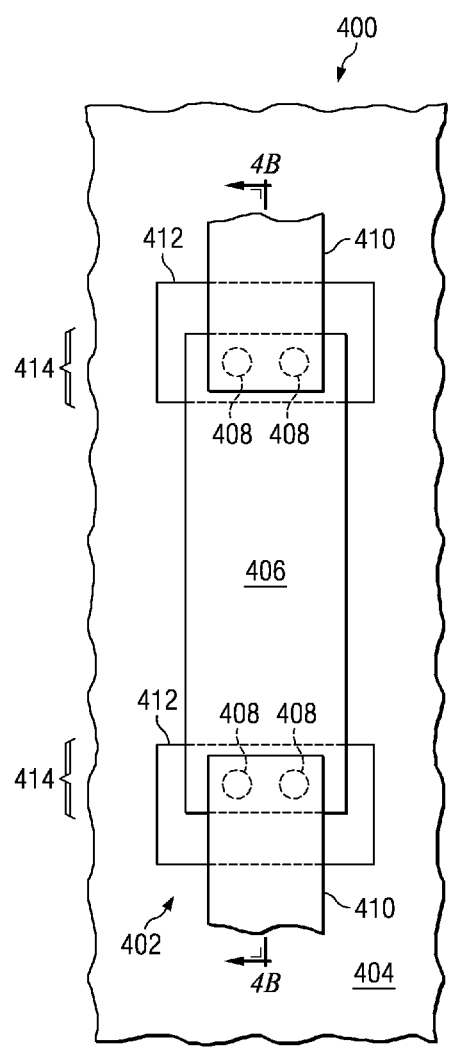
FIG. 4A is a top view of another example implementation of a resistor formed in an integrated circuit (IC) in accordance with principles of the invention.
Figure 4B:
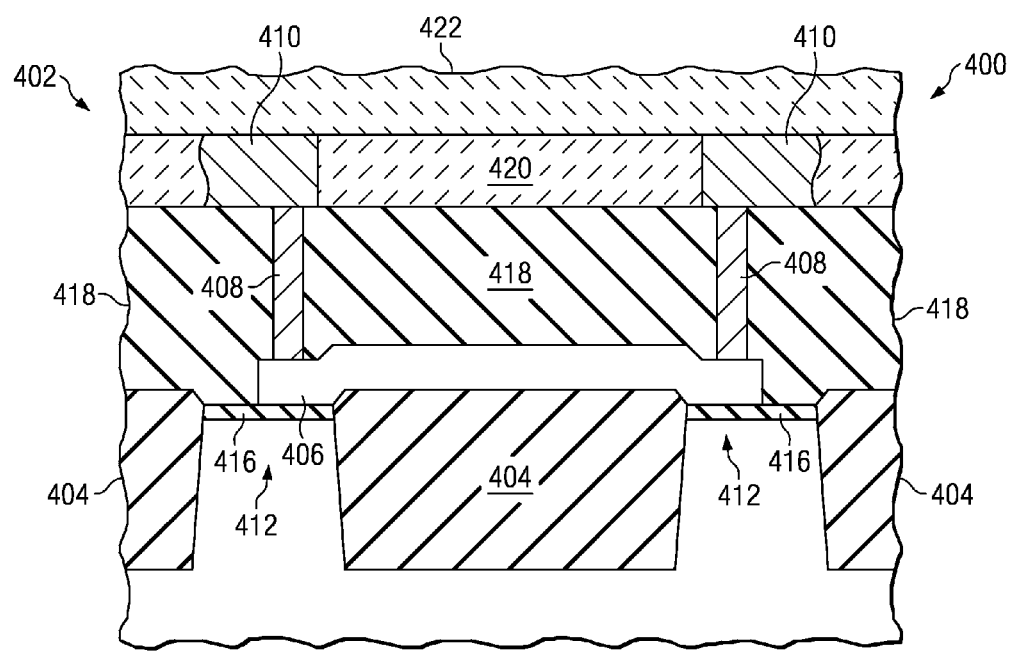
FIG. 4B is a cross-sectional view of the same resistor, taken along the line 4B-4B of FIG. 4A.

FIGS. 4A and 4B depict an IC 400 including a resistor 402 formed according to another example embodiment of principles of the invention. In this example, a small area at each end of a resistor body 406 is formed over an active region 412, while a majority of the area of the resistor body 406 is formed over a region of field oxide 404. The active regions 412 are covered with a higher thermal conductivity oxide layer and extend partially under the ends of the resistor body 406 in order to provide a shortened thermal path to the IC substrate. As with the prior embodiments, the resistor 402 includes contacts 408 formed on the resistor body 406, and metal interconnect lines 410 formed on the contacts 408 to electrically connect the resistor 402 to other IC components. In a preferred embodiment, an added capacitance resulting from an overlap of the resistor body 406 and the active regions 412 does not significantly increase the total capacitance of the resistor 402 with respect to the IC substrate. This is advantageous because the trade-off between heatsinking and capacitive loading may be optimized for the instant resistor 402 with respect to the total IC. The substrate regions 412 may be located to optimize heatsinking of parts of the resistor 402 that are most sensitive to Joule heating, for example, the resistor heads 414. This is advantageous because an overall fail rate for the resistor 402 may be lowered while minimizing the effect of capacitive loading on the circuit containing the instant resistor.

As shown in FIG. 4B, the resistor body 406 is formed predominantly over the field oxide 404 and partially overlaps the substrate regions 412 for only a relatively small area (relative to the plane of the substrate). An electrically insulating layer 416, such as a gate dielectric layer for a MOS transistor, is formed between the IC substrate active regions 412 and the resistor body 406. The electrically insulating layer 416 provides a high thermal conductance (e.g., greater than 0.4 milliwatts per square micron per degree Kelvin) and a very high electrical impedance (e.g., greater than $3 \times 10^{15}$ ohm-micron$^2$) between the overlapping portion of the resistor body 406 and the active region 412. Contacts 408 extend from the resistor body 406 through a pre-metal dielectric (PMD) layer 418 to connect to metal interconnect lines 410 formed in a first intra-metal dielectric (IMD) layer 420, and an interlevel dielectric (ILD) layer 422 is formed on a top surface of the first IMD layer 420.

The embodiments discussed above may be enhanced by blocking ion implants from the substrate regions under the cooling fingers and under the resistor body to increase the thermal conductivity of the silicon in the active region.

It will be recognized by practitioners of integrated circuit design and fabrication that cooling a resistor will allow an increase in current through the resistor without causing an increase in rates of degradation mechanisms. This is advantageous because it expands the operating range of the resistor. It will also be recognized that cooling a resistor will allow a decrease in resistor body size without decreasing the current through the resistor or causing an increase in rates of degradation mechanisms. This is advantageous because it allows a reduction in area of the integrated circuit containing the resistor, leading to lower manufacturing costs per integrated circuit.

Those skilled in the art to which the invention relates will appreciate that other embodiments and modifications may be made within the scope of the claimed invention.

What is claimed is:

1. An integrated circuit, comprising:
    a substrate having at least one field oxide region, at least one dielectric oxide region r, and a substrate region, wherein the at least one dielectric-oxide region has a greater thermal conductivity than the at least one field oxide region,
    a resistor comprising a resistor body having a major portion formed over the field oxide region and a minor portion extending beyond the field oxide region to overlap and couple to at least a portion of the at least one dielectric oxide region,
    wherein all parts of the resistor overlying the dielectric oxide region do not conduct a substantial flow of electricity; which is further at least due to the minor region coupling to the electrically insulating dielectric oxide region that is interposed between the resistor and the substrate region, and
    electrical contacts formed on the resistor body.

2. The integrated circuit of claim 1, wherein an active region of the substrate includes the dielectric oxide region.

3. The integrated circuit of claim 2, wherein the dielectric oxide region is a dielectric material located between the active region and the minor portion.

4. The integrated circuit of claim 3, wherein the resistor body is an elongated resistor body; and the electrical contacts comprise contacts at opposite ends of the elongated resistor body.

5. The integrated circuit of claim 4, wherein the minor portion comprises a plurality of fingers extending beyond the field oxide region substantially at right angles to the resistor body and into positions of partial overlap with dielectric oxide region, which overlays an active region.

6. The integrated circuit of claim 5, wherein the resistor body is formed over the field oxide region except for the fingers.

7. An integrated circuit, comprising:
    a silicon substrate;
    a field oxide region formed in the silicon substrate;
    an active region formed in the silicon substrate;
    a MOS transistor dielectric layer formed over the active region wherein the MOS transistor dielectric layer and the active region have a higher thermal conductivity than the field oxide region;
    a resistor including an elongated resistor body having a major portion formed over the field oxide region and a minor portion overlapping the active region and coupled to the dielectric oxide region; the MOS transistor dielectric layer being disposed between the minor portion and the active region, wherein the minor portion does not conduct a substantial flow of electricity due at least in part to a coupling of the minor portion to the MOS transistor dielectric layer; and
    electrical contacts formed on opposite ends of the resistor body.

8. A method of manufacturing an integrated circuit including a resistor, comprising:
    forming an active region in a substrate;
    forming a region of field oxide material in the substrate;
    forming a dielectric oxide layer over the active region; wherein both the dielectric oxide layer and the active region have a greater thermal conductivity than the region of field oxide material;
    forming an elongated resistor body with a major portion formed over the region of field oxide material and a minor portion formed extending beyond the region of field oxide material to overlap at least a portion of the active region and overlaying and coupled to at least a portion of the at least one dielectric oxide region, wherein the resistor does not conduct a substantial flow of electricity on all parts of resistor overlaying the dielectric oxide region, which is at least due to the minor region coupling to the electrically insulating dielectric oxide region that is interposed between the resistor and the substrate; and forming electrical contacts formed at respective end portions of the resistor body.

9. The method of claim 8, wherein the active region is formed by doping a region through a patterned mask that blocks dopant from at least the overlapped portion of the active region.

10. The integrated circuit of claim 7, wherein the opposite ends of the resistor body include silicided resistor heads; and the electrical contacts are formed on the silicided resistor heads.

11. The integrated circuit of claim 7, wherein the active region comprises first and second active regions; and wherein the minor portion comprises first and second pluralities of cooling fingers extending outwardly from the major portion to overlap at least portions of the respective first and second active regions.

12. The integrated circuit of claim 11, wherein the active region further comprises third and fourth active regions; and wherein the minor portion further comprises third and fourth pluralities of cooling fingers extending outwardly from the major portion to overlap at least portions of the respective third and fourth active regions.

13. The integrated circuit of claim 12, wherein the first and second pluralities of cooling fingers comprise two rows of fingers formed integrally with the resistor body and extending laterally from spaced positions along perimetrical sides of the resistor body.

14. The integrated circuit of claim 13, wherein the fingers of the two rows are located proximate the ends of the resistor body.

15. The integrated circuit of claim 13, further comprising metal interconnect lines formed on the contacts and not overlapping the two rows of fingers.

16. The integrated circuit of claim 13, wherein the third and fourth pluralities of cooling fingers comprise additional two rows of fingers formed integrally with the resistor body and extending longitudinally from spaced positions along perimetrical positions at the ends of the resistor body.

17. The integrated circuit of claim 12, wherein the first and second pluralities of cooling fingers comprise two rows of fingers formed integrally with the resistor body and extending longitudinally from spaced positions along perimetrical positions at the ends of the resistor body.

18. The integrated circuit of claim 17, further comprising metal interconnect lines formed on the contacts, extending from the ends of the resistor body.

19. The integrated circuit of claim 18, wherein the ends are silicided.

20. The integrated circuit of claim 1, wherein the field oxide region is shallow trench isolation (STI) with a thickness of 250 to 500 nanometers.

21. The integrated circuit of claim 1, wherein the substrate comprises silicon.

22. The integrated circuit of claim 5, wherein the overlap between the active area and the resistor body form a capacitor that does not substantially change the electrical impedance of the resistor.

23. The integrated circuit of claim 22, wherein the dielectric oxide is a gate oxide.

24. The integrated circuit of claim 22, wherein a thermal path from the resistor body through the fingers to an active region including the dielectric oxide is shorter and offers less thermal resistance than a thermal path from the resistor body through the field oxide under the resistor.

* * * * *